(12) United States Patent
Villavicencio et al.

(10) Patent No.: US 9,659,848 B1
(45) Date of Patent: May 23, 2017

(54) STIFFENED WIRES FOR OFFSET BVA

(71) Applicant: Invensas Corporation, San Jose, CA (US)

(72) Inventors: Grant Villavicencio, San Jose, CA (US); Sangil Lee, Santa Clara, CA (US); Roseann Alatorre, San Jose, CA (US); Javier A. Delacruz, Santa Clara, CA (US); Scott McGrath, Scotts Valley, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/086,899

(22) Filed: Mar. 31, 2016

Related U.S. Application Data

(60) Provisional application No. 62/257,223, filed on Nov. 18, 2015.

(51) Int. Cl.
 *H01L 23/48* (2006.01)
 *H01L 21/00* (2006.01)
 (Continued)

(52) U.S. Cl.
 CPC .... *H01L 23/49811* (2013.01); *H01L 21/4825* (2013.01); *H01L 21/4853* (2013.01);
 (Continued)

(58) Field of Classification Search
 CPC ..... H01L 24/85; H01L 24/49; H01L 25/0657; H01L 23/49811; H01L 21/4825;
 (Continued)

(56) References Cited

U.S. PATENT DOCUMENTS 3,289,452 A 12/1966 Koellner
3,358,897 A 12/1967 Christensen
(Continued)

FOREIGN PATENT DOCUMENTS

CN 1641832 A 7/2005
CN 1877824 A 12/2006
(Continued)

OTHER PUBLICATIONS

International Preliminary Report on Patentability, Chapter II, for Application No. PCT/US2014/055695 dated Dec. 15, 2015.
(Continued)

*Primary Examiner* — Alonzo Chambliss
(74) *Attorney, Agent, or Firm* — Lerner, David, Littenberg, Krumholz & Mentlik, LLP

(57) ABSTRACT

A component can include a generally planar element, a reinforcing dielectric layer overlying the generally planar element, an encapsulation overlying the reinforcing dielectric layer, and a plurality of wire bonds. Each wire bond can have a tip at a major surface of the encapsulation. The wire bonds can have first portions extending within the reinforcing dielectric layer. The first portions of at least some of the wire bonds can have bends that change an extension direction of the respective wire bond. The reinforcing dielectric layer can have protruding regions surrounding respective ones of the wire bonds, the protruding regions extending to greater peak heights from the first surface of the generally planar element than portions of the reinforcing dielectric layer between adjacent ones of the protruding regions. The peak heights of the protruding regions can coincide with points of contact between the reinforcing dielectric layer and individual wire bonds.

21 Claims, 2 Drawing Sheets

(51) Int. Cl.
*H01L 23/498* (2006.01)
*H01L 23/31* (2006.01)
*H01L 23/495* (2006.01)
*H01L 23/043* (2006.01)
*H01L 23/053* (2006.01)
*H01L 21/48* (2006.01)
*H01L 21/56* (2006.01)
*H01L 23/00* (2006.01)
H01L 25/065 (2006.01)

(52) U.S. Cl.
CPC .......... *H01L 21/565* (2013.01); *H01L 23/043* (2013.01); *H01L 23/053* (2013.01); *H01L 23/3121* (2013.01); *H01L 23/4952* (2013.01); *H01L 23/49838* (2013.01); *H01L 24/49* (2013.01); *H01L 24/85* (2013.01); *H01L 25/0657* (2013.01)

(58) Field of Classification Search
CPC . H01L 21/4853; H01L 21/565; H01L 23/043; H01L 23/053; H01L 23/3121; H01L 23/4952; H01L 23/49838
See application file for complete search history.

(56) References Cited

U.S. PATENT DOCUMENTS

| | | |
|---|---|---|
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | Difrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee |
| 6,313,528 B1 | 11/2001 | Solberg |

(56) References Cited

U.S. PATENT DOCUMENTS

| | | |
|---|---|---|
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,399,426 B1 | 6/2002 | Capote et al. |
| 6,407,448 B2 | 6/2002 | Chun |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Yin et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B2 | 3/2007 | Hiner et al. |
| 7,190,061 B2 | 3/2007 | Lee |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,268,421 B1 | 9/2007 | Lin et al. |
| 7,276,799 B2 | 10/2007 | Lee et al. |
| 7,294,920 B2 | 11/2007 | Chen et al. |
| 7,294,928 B2 | 11/2007 | Bang et al. |
| 7,323,767 B2 | 1/2008 | James et al. |
| 7,344,917 B2 | 3/2008 | Gautham |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,857,190 B2 | 12/2010 | Takahashi et al. |
| 7,880,290 B2 | 2/2011 | Park |
| 7,892,889 B2 | 2/2011 | Howard et al. |
| 7,902,644 B2 | 3/2011 | Huang et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |

(56) References Cited

U.S. PATENT DOCUMENTS

| | | |
|---|---|---|
| 7,939,934 B2 | 5/2011 | Haba et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,970 B2 | 10/2011 | Yamamori et al. |
| 8,058,101 B2 | 11/2011 | Haba et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,299,368 B2 | 10/2012 | Endo |
| 8,304,900 B2 | 11/2012 | Jang et al. |
| 8,314,492 B2 | 11/2012 | Egawa |
| 8,319,338 B1 | 11/2012 | Berry et al. |
| 8,372,741 B1 | 2/2013 | Co et al. |
| 8,404,520 B1 | 3/2013 | Chau et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 | 12/2013 | Sato et al. |
| 8,659,164 B2 | 2/2014 | Haba |
| 8,680,684 B2 | 3/2014 | Haba et al. |
| 8,728,865 B2 | 5/2014 | Haba et al. |
| 8,836,136 B2 * | 9/2014 | Chau ............... H01L 23/49517 257/735 |
| 8,878,353 B2 | 11/2014 | Haba et al. |
| 8,907,466 B2 | 12/2014 | Haba |
| 8,927,337 B2 | 1/2015 | Haba et al. |
| 8,987,132 B2 | 3/2015 | Gruber et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,123,664 B2 | 9/2015 | Haba |
| 9,136,254 B2 * | 9/2015 | Zhao ............... H01L 23/49811 |
| 9,153,562 B2 | 10/2015 | Haba et al. |
| 9,224,717 B2 | 12/2015 | Sato et al. |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0139893 A1 | 6/2006 | Yoshimura et al. |
| 2006/0166397 A1 | 7/2006 | Lau et al. |
| 2006/0197220 A1 | 9/2006 | Beer |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0013067 A1 | 1/2007 | Nishida et al. |
| 2007/0015353 A1 | 1/2007 | Craig et al. |
| 2007/0035015 A1 | 2/2007 | Hsu |
| 2007/0045803 A1 | 3/2007 | Ye et al. |
| 2007/0090524 A1 | 4/2007 | Abbott |
| 2007/0126091 A1 | 6/2007 | Wood et al. |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |

(56) References Cited

U.S. PATENT DOCUMENTS

| | | |
|---|---|---|
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0211084 A1 | 9/2008 | Chow et al. |
| 2008/0230887 A1 | 9/2008 | Sun et al. |
| 2008/0277772 A1 | 11/2008 | Groenhuis et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1 | 2/2009 | Jiang et al. |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0121351 A1 | 5/2009 | Endo |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1 | 9/2009 | Lee et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2009/0316378 A1 | 12/2009 | Haba et al. |
| 2010/0000775 A1 | 1/2010 | Shen et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0148374 A1 | 6/2010 | Castro |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0057308 A1 | 3/2011 | Choi et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0175213 A1 | 7/2011 | Mori et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0007232 A1 | 1/2012 | Haba |
| 2012/0015481 A1 | 1/2012 | Kim |
| 2012/0018885 A1 | 1/2012 | Lee et al. |
| 2012/0020026 A1 | 1/2012 | Oganesian et al. |
| 2012/0025365 A1 | 2/2012 | Haba |
| 2012/0034777 A1 | 2/2012 | Pagaila et al. |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0104595 A1 | 5/2012 | Haba et al. |
| 2012/0104624 A1 | 5/2012 | Choi et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2012/0326337 A1 | 12/2012 | Camacho et al. |
| 2013/0032944 A1 | 2/2013 | Sato et al. |
| 2013/0037802 A1 | 2/2013 | England et al. |
| 2013/0049218 A1 | 2/2013 | Gong et al. |
| 2013/0049221 A1 | 2/2013 | Han et al. |
| 2013/0069222 A1 | 3/2013 | Camacho |
| 2013/0082399 A1 | 4/2013 | Kim et al. |
| 2013/0093087 A1 | 4/2013 | Chau et al. |
| 2013/0093088 A1* | 4/2013 | Chau ............... H01L 23/49517 257/738 |
| 2013/0095610 A1* | 4/2013 | Chau ............... H01L 23/49517 438/109 |
| 2013/0105979 A1 | 5/2013 | Yu et al. |

(56) References Cited

U.S. PATENT DOCUMENTS

| | | | |
|---|---|---|---|
| 2013/0134588 A1 | 5/2013 | Yu et al. | |
| 2013/0182402 A1 | 7/2013 | Chen et al. | |
| 2013/0200533 A1* | 8/2013 | Chau | H01L 23/49517 257/784 |
| 2013/0234317 A1 | 9/2013 | Chen et al. | |
| 2013/0241083 A1 | 9/2013 | Yu et al. | |
| 2014/0021605 A1 | 1/2014 | Yu et al. | |
| 2014/0036454 A1 | 2/2014 | Caskey et al. | |
| 2014/0124949 A1 | 5/2014 | Paek et al. | |
| 2014/0220744 A1* | 8/2014 | Damberg | H01L 25/105 438/127 |
| 2014/0264945 A1 | 9/2014 | Yap et al. | |
| 2015/0017765 A1 | 1/2015 | Co et al. | |
| 2015/0044823 A1* | 2/2015 | Mohammed | H01L 21/4853 438/126 |

FOREIGN PATENT DOCUMENTS

| | | |
|---|---|---|
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 11317476 | 11/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 200447702 | 2/2004 |
| JP | 2004047702 A | 2/2004 |
| JP | 2004-172157 A | 6/2004 |
| JP | 2004281514 A | 10/2004 |
| JP | 2004-319892 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007234845 | 9/2007 |
| JP | 2007287922 A | 11/2007 |
| JP | 2007-335464 | 12/2007 |
| JP | 2007335464 A | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| KR | 100265563 | 9/2000 |
| KR | 20010061849 A | 7/2001 |
| KR | 2001-0094894 A | 11/2001 |
| KR | 10-0393102 | 7/2002 |
| KR | 2002058216 A | 7/2002 |
| KR | 2006064291 A | 6/2006 |
| KR | 2008020069 A | 3/2008 |
| KR | 100865125 B1 | 10/2008 |
| KR | 20080094251 A | 10/2008 |
| KR | 100886100 B1 | 2/2009 |
| KR | 2009033605 A | 4/2009 |
| KR | 20090123680 A | 12/2009 |
| KR | 2010033012 A | 3/2010 |
| KR | 2010062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2010041630 A1 | 4/2010 |
| WO | 2010101163 A1 | 9/2010 |
| WO | 2013059181 A1 | 4/2013 |
| WO | 2013065895 A1 | 5/2013 |
| WO | 2014107301 A1 | 7/2014 |

OTHER PUBLICATIONS

International Search Report and Written Opinion for Application No. PCT/US2014/014181 dated Jun. 13, 2014.
International Search Report and Written Opinion for Application No. PCT/US2014/050125 dated Feb. 4, 2015.
International Search Report and Written Opinion for Application No. PCT/US2014/050148 dated Feb. 9, 2015.
International Search Report and Written Opinion for Application No. PCT/US2014/055695 dated Mar. 20, 2015.
Partial International Search Report for Application No. PCT/US2014/014181 dated May 8, 2014.
U.S. Appl. No. 13/477,532 filed May 22, 2012.
Written Opinion for Application No. PCT/US2014/050125 dated Jul. 15, 2015.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.

(56) References Cited

OTHER PUBLICATIONS

International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Partial International Search Report for Application No. PCT/US2015/033004 dated Sep. 9, 2015.
Taiwanese Office Action for Application No. 102106326 dated Sep. 18, 2015.
Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages (2008).
International Search Report, PCT/US2005/039716, Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2003.
International Search Report and Written Opinion for Application No. PCT/US2011/044346 dated May 11, 2012.
Partial International Search Report from Invitation to Pay Additional Fees for Application No. PCT/US2012/028738 dated Jun. 6, 2012.
Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Office Action from U.S. Appl. No. 12/769,930 mailed May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
International Search Report and Written Opinion for Application No. PCT/US2011/024143 dated Jan. 17, 2012.

* cited by examiner

STIFFENED WIRES FOR OFFSET BVA

CROSS-REFERENCE TO RELATED APPLICATION

This application claims the benefit of the filing date of U.S. Provisional Patent Application No. 62/257,223 filed Nov. 18, 2015, the disclosure of which is hereby incorporated herein by reference.

BACKGROUND OF THE INVENTION

Embodiments of the invention herein relate to various structures and ways of making microelectronic packages which can be used in package on package assemblies, and more particularly, to such structures that incorporate wire bonds for as part of the package-on-package connections.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited. Despite all of the above-described advances in the art, still further improvements in making and testing microelectronic packages would be desirable.

BRIEF SUMMARY OF THE INVENTION

In accordance with an aspect of the invention, a component can include a generally planar element having oppositely-facing first and second surfaces extending in first and second transverse directions, a reinforcing dielectric layer overlying the first surface of the generally planar element, an encapsulation overlying the reinforcing dielectric layer, and a plurality of wire bonds. The generally planar element can have a plurality of contacts at the first surface. The encapsulation can have a major surface facing away from the first surface of the generally planar element. Each wire bond can have a base joined with a contact of the plurality of contacts, and a tip remote from the base at the major surface of the encapsulation.

The wire bonds can have first portions extending within at least a portion of the reinforcing dielectric layer and second portions extending within the encapsulation. The first portions of at least some of the wire bonds can have bends that change an extension direction of the respective wire bond in at least one of the first and second directions. The reinforcing dielectric layer can have protruding regions surrounding respective wire bonds of the plurality of wire bonds, the protruding regions extending to greater peak heights from the first surface of the generally planar element than portions of the reinforcing dielectric layer between adjacent ones of the protruding regions. The peak heights of the protruding regions can coincide with points of contact between the reinforcing dielectric layer and individual ones of the wire bonds.

In one embodiment, the component can comprise microelectronic package. The microelectronic package can also include a microelectronic element having oppositely-facing top and bottom surfaces. The bottom surface can face the first surface of the generally planar element and can be mechanically coupled therewith. The major surface of the encapsulation can overlie the top surface of the microelectronic element. In a particular example, the tips of a subset of the at least some of the wire bonds overlie the top surface of the microelectronic element. In an exemplary embodiment, the bases of the wire bonds can define a first minimum pitch between adjacent ones of the bases, and the tips of the wire bonds can define a second minimum pitch between adjacent ones of the tips, the second minimum pitch being greater than the first minimum pitch. In one example, the dielectric layer can overlie the top surface of the microelectronic element.

In a particular embodiment, the reinforcing dielectric layer can include a first reinforcing dielectric layer overlying the first surface of the generally planar element, and a second reinforcing dielectric layer overlying the first reinforcing dielectric layer and defining an upper surface of the reinforcing dielectric layer. In one embodiment, the bends of the first portions of the wire bonds can be first bends, and the at least some of the wire bonds can each include a second bend changing the extension direction of the respective wire bond in at least one of the first and second directions. In a particular example, at least some of the second bends of the wire bonds can be disposed within the reinforcing dielectric layer. In an exemplary embodiment, the reinforcing dielectric layer can be configured to maintain the position of the tips of the wire bonds in a third direction perpendicular to the first and second directions when a force is applied to the tips of the wire bonds in the third direction.

In one example, the microelectronic package described above can also include a plurality of upper terminals joined with corresponding ones of the wire bonds. The upper terminals can be at the major surface of the encapsulation and can be configured to be electrically connected with conductive elements of a component external to the microelectronic package. In a particular embodiment, a microelectronic assembly can comprise the microelectronic package as described above. The microelectronic assembly can also include a second component having terminals, the tips of the wire bonds being electrically connected to the terminals. In one embodiment, a system can include the microelectronic package as described above and one or more other electronic components electrically connected to the microelectronic package. In a particular example, the system can also include a housing, the microelectronic package and the one or more other electronic components being assembled with the housing.

In accordance with another aspect of the invention, a microelectronic package can include a generally planar element having oppositely-facing first and second surfaces extending in first and second transverse directions, a reinforcing dielectric layer overlying the first surface of the generally planar element, an encapsulation overlying the reinforcing dielectric layer, a microelectronic element having oppositely-facing top and bottom surfaces, and a plurality of wire bonds. The generally planar element can have a plurality of contacts at the first surface. The encapsulation can have a major surface facing away from the first surface of the generally planar element. The bottom surface of the microelectronic element can face the first surface of the generally planar element and can be mechanically coupled therewith. The major surface of the encapsulation can overlie the top surface of the microelectronic element.

Each wire bond can have a base joined with a contact of the plurality of contacts, and a tip remote from the base at the major surface of the encapsulation. The wire bonds can have first portions extending within at least a portion of the reinforcing dielectric layer and second portions extending within the encapsulation. The first portions of at least some of the wire bonds can have bends that change an extension direction of the respective wire bond in at least one of the first and second directions. The reinforcing dielectric layer can extend to a greater peak height from the first surface of the generally planar element than the microelectronic element. In an exemplary embodiment, the tips of a subset of the at least some of the wire bonds can overlie the top surface of the microelectronic element. In one example, the bends of the first portions of the wire bonds can be first bends, and the at least some of the wire bonds can each include a second bend changing the extension direction of the respective wire bond in at least one of the first and second directions.

In accordance with yet another aspect of the invention, a method of forming a component can include providing a generally planar element having oppositely-facing first and second surfaces extending in first and second transverse directions, forming a plurality of wire bonds, forming a reinforcing dielectric layer overlying the first surface of the generally planar element, flowing an encapsulation between the reinforcing dielectric layer and a lower surface of a molding film into which tips of the wire bonds extend, and removing the molding film from the encapsulation. The generally planar element can have a plurality of contacts at the first surface. Each wire bond can have a base joined with a contact of the plurality of contacts and a tip remote from the base. First portions of at least some of the wire bonds can have bends that change an extension direction of the respective wire bond in at least one of the first and second directions.

The first portions of the wire bonds can extend within at least a portion of the reinforcing dielectric layer. The reinforcing dielectric layer can have protruding regions surrounding respective wire bonds of the plurality of wire bonds. The protruding regions can extend to greater peak heights from the first surface of the generally planar element than portions of the reinforcing dielectric layer between adjacent ones of the protruding regions. The peak heights of the protruding regions can coincide with points of contact between the reinforcing dielectric layer and individual ones of the wire bonds. The encapsulation can have a major surface facing away from the first surface of the generally planar element. The wire bonds can have second portions extending within the encapsulation. The tips of the wire bonds can be at the major surface of the encapsulation.

In a particular embodiment, the component can comprise a microelectronic package as described above. The microelectronic package can also include a microelectronic element having oppositely-facing top and bottom surfaces. The bottom surface of the microelectronic element can face the first surface of the generally planar element and can be mechanically coupled therewith. The major surface of the encapsulation can overlie the top surface of the microelectronic element. In one embodiment, the protruding regions can wick up the wire bonds and can reach their respective peak heights before the flowing of the encapsulation. In a particular example, the peak heights of the protruding regions may not reach the tips of the wire bonds. In an exemplary embodiment, the method can also include, before the flowing of the encapsulation, depositing the molding film overlying the reinforcing dielectric layer. The tips of the wire bonds can extend into the molding film.

DETAILED DESCRIPTION

Figure 1:
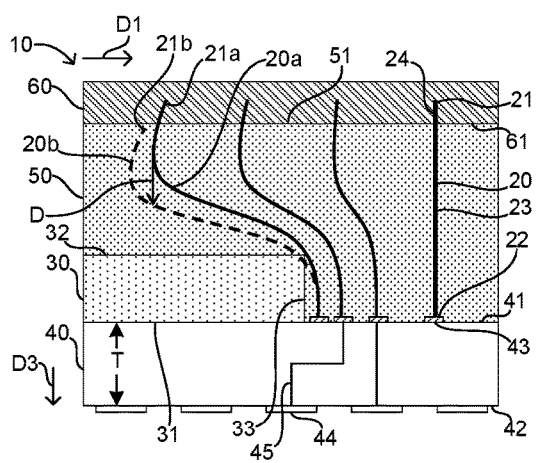
FIG. 1 illustrates a side sectional view of a microelectronic package including wire bonds extending through an encapsulant between a substrate and a molding film, according to an embodiment of the invention.

A component in the form of an in-process microelectronic package 10 can be fabricated by joining and electrically connecting a plurality of wire bonds 20 and a microelectronic element 30 to a generally planar element in the form of a substrate 40 having a first surface 41 and a second surface 42 opposite the first surface, in accordance with an embodiment of the disclosure, as shown in FIG. 1. Electrically conductive contacts 43 and electrically conductive terminals 44, in the form of contacts or pads, can be arranged, respectively, at the first and second surfaces 41, 42. The in-process microelectronic package 10 can include an encapsulation 50 that is formed extending between the individual wire bonds 20 and overlying the microelectronic element 30 and the substrate 40. A molding film 60 can be placed over tips 21 of the wire bonds 20, to secure the locations of the wire bonds while the encapsulation 50 is formed.

As used in this disclosure, terms such as "upper," "lower," "top," "bottom," "above," "below," and similar terms denoting directions, refer to the frame of reference of the components themselves, rather than to the gravitational frame of reference. With the parts oriented in the gravitational frame of reference in the directions shown in the figures, with the top of drawing being up and the bottom of the drawing being down in the gravitational frame of reference, the top surface of the microelectronic element is, indeed, above the bottom surface of the microelectronic element in the gravitational frame of reference. However, when the parts are turned over, with the top of the drawing facing downwardly in the gravitational frame of reference, the top surface of the microelectronic element is below the bottom surface of the microelectronic element in the gravitational frame of reference.

As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate. As used herein, the terms "about" and "approximately" with respect to a given numerical value means that the actual value is within a typical manufacturing tolerance known to one skilled in the relevant art of the given numerical value.

The plurality of wire bonds 20 can be joined electrically with at least some of the contacts 43. Each of the wire bonds 20 can be bonded at a base 22 thereof, such as a ball bond or a wedge bond, to a respective contact 43. Each of the wire bonds 20 can extend to a tip 21 remote from the base 22 of such wire bond and remote from substrate 20, and can include an edge surface 23 extending from the tip 21 to the base 22. In particular examples, the wire bonds 20 can have a diameter of 2 mils (~51 microns), less than 2 mils, 1.5 mils (~38 microns), less than 1.5 mils, 1 mil (~25 microns), or less than 1 mil.

The tips 21 of the wire bonds 20 can be available for electrical connection, either directly or indirectly as through a solder ball, electrically conductive contact, or other features discussed herein, to conductive elements external to the microelectronic package 10. The particular size and shape of bases 22 of the wire bonds 20 can vary according to the type of material used to form the wire bonds, the desired strength of the connection between the wire bonds and the contacts 43, or the particular process used to form the wire bonds. The wire bonds 20 can have a construction and can be formed on the substrate 40 extending from the contacts 43 in any suitable manner, such as described in U.S. Patent Application Pub. No. 2013/0093087, filed Feb. 24, 2012, which is hereby incorporated by reference herein.

The microelectronic element 30 can be mechanically coupled to the first surface 41 of the substrate 40, e.g., with an adhesive material, with a bottom surface 31 of the microelectronic element confronting the first surface of the substrate. The microelectronic element 30 can have a top surface 32 opposite the bottom surface 31. The microelectronic element can have element contacts (not shown) at either or both of the bottom and top surfaces 31, 32. As described herein, the element contacts of the microelectronic element 30 can also be referred to as "chip contacts." In one example, the element contacts of the microelectronic element 30 can be at one of the bottom or top surfaces 31 or 32 within a central region thereof. For example, the element contacts can be arranged in one or two parallel rows adjacent the center of the bottom or top surface 31 or 32.

Although in the figures, the particular electrical connection between the microelectronic element 30 and the substrate 40 is not shown, the invention contemplates various types of electrical connections between the microelectronic element and the substrate, including, for example, a "flip-chip" configuration, where element contacts (not shown) at the bottom surface 31 of the microelectronic element 30 can be connected to conductive elements at the first surface 41 of the substrate 40, such as by conductive joining elements (not shown) that are positioned beneath the microelectronic element. In some embodiments, such conductive joining elements can be, for example, masses of a bond metal such as solder, tin, indium, a eutectic composition or combination thereof, or another joining material such as an electrically conductive paste, an electrically conductive adhesive or electrically conductive matrix material or a combination of any or all of such bond metals or electrically conductive materials.

In one example, element contacts at the bottom surface 31 of the microelectronic element 30 can be electrically connected with contacts at the second surface 42 of the substrate 40 by conductive structure (e.g., wire bonds or lead bonds) extending through an aperture in the substrate. In another example, element contacts at the top surface 32 of the microelectronic element 30 can be electrically connected with contacts at the first surface 41 of the substrate 40 by conductive structure (e.g, wire bonds) extending above the top surface of the microelectronic element.

In some embodiments, the microelectronic element 30 can each be a semiconductor chip, a wafer, or the like. For example, the microelectronic element 30 can each comprise a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In one example, the microelectronic element 30 can have memory storage array function. In a particular embodiment, the microelectronic element 30 can embody a greater number of active devices to provide memory storage array function than any other function.

The microelectronic element 30 can embody a plurality of active devices (e.g., transistors, diodes, etc.), a plurality of passive devices (e.g., resistors, capacitors, inductors, etc.), or both active devices and passive devices. In a particular embodiment, the microelectronic element 30 can be configured to have a predominant function as a logic chip, e.g., a programmable general or special purpose processor, a microcontroller, a field programmable gate array ("FPGA") device, an application specific integrated circuit ("ASIC"), a digital signal processor, among others, or a predominant function other than as a logic chip, such as a memory, for example, a volatile memory storage area, e.g., dynamic random access memory ("DRAM"), static random access memory ("SRAM"), a nonvolatile memory storage array such as flash memory or magnetic random access memory ("MRAM"). As such, the embodiment of FIG. 1 is in the form of an in-process packaged microelectronic element such as a semiconductor chip assembly that is used in computer or other electronic applications.

Although in the figures, a single microelectronic element 30 is shown in the microelectronic package 10 (and in the other microelectronic packages herein), each microelectronic package in this disclosure can include a plurality of microelectronic elements, arranged either adjacent to one another along the first surface 41 of the substrate 40, in a vertical stack overlying the first surface of the substrate, or in other configurations known in the art.

The substrate 40 may include a dielectric element, which in some cases can consist essentially of polymeric material, e.g., a resin or polyimide, among others, and which may be substantially flat. The dielectric element may be sheet-like and may be thin. Alternatively, the substrate 40 can include a dielectric element having a composite construction such as glass-reinforced epoxy, e.g., of BT resin or FR-4 construction. In particular embodiments, the dielectric element can include one or more layers of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials. In another example, the substrate can include a supporting element of material having a coefficient of thermal expansion ("CTE") of less than 12 parts per million per degree Celsius ("ppm/° C."), on which the contacts 41, terminals 42, and other conductive structure can be disposed. For example, such low CTE element can consist essentially of glass, ceramic, semiconductor material, or liquid crystal polymer material, or a combination of such materials. Alternatively, the substrate 40 can be a circuit panel or circuit board. In one example thereof, the substrate 40 can be a module board of a dual-inline memory module ("DIMM"). In one example, the substrate can include a supporting element of material having a CTE of less than 30 ppm/° C.

The first surface 41 and second surface 42 can be substantially parallel to each other and spaced apart at a distance perpendicular to the surfaces defining the thickness of the substrate T. The thickness of the substrate 40 can be within a range of generally acceptable thicknesses for the present application. In one embodiment, the distance between the first surface 41 and the second surface 42 is between about 10-500 μm. For purposes of this discussion, the first surface 41 may be described as being positioned opposite or remote from the second surface 42. Such a description, as well as any other description of the relative position of elements used herein that refers to a vertical or horizontal position of such elements is made for illustrative purposes only to correspond with the position of the elements within the drawings, and is not limiting.

The contacts 43 and the terminals 44 can be flat, thin electrically conductive elements. The contacts 43 and the terminals 44 can be a solid metal material, such as copper, gold, nickel, palladium, or other materials that are acceptable for such an application, including various alloys including one or more of copper, gold, nickel, palladium or combinations thereof. At least some of the contacts 43 can be interconnected to corresponding terminals 44. Such an interconnection may be completed using vias 45 formed in the substrate 40 that can be lined or filled with conductive metal that can be formed of the same material as the contacts 43 and the terminals 44. Optionally, the contacts 43 and the terminals 44 can be further interconnected to one another by traces (not shown) on the substrate 40. The terminals 44 can be configured for electrical interconnection with an external component such as another microelectronic package or a circuit panel, e.g., a circuit board.

First and second transverse directions D1, D2 parallel to the first surface 41 of the substrate 40 (shown in FIG. 4) are referred to herein as "horizontal" or "lateral" directions, whereas the directions (e.g., D3) perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The encapsulation 50 can be formed extending between the individual wire bonds 20 and overlying the top surface 32 of the microelectronic element 30 and the first surface 41 of the substrate 40. The encapsulation 50 can be formed from a dielectric material, such as those materials known in the art as being typically used for encapsulations or overmolds. In the embodiment of FIG. 1, the encapsulation 50 can be formed, for example, by film-assisting molding or like techniques, over the portions of the first surface 41 of the substrate 40 that are not otherwise covered by or occupied by the microelectronic element 30, or the contacts 43.

The encapsulation 50, desirably an integral, continuous dielectric layer, can serve to protect the conductive elements within the microelectronic package 10, particularly the wire bonds 20. The encapsulation 50 can also substantially cover the microelectronic element 30, the wire bonds 20, including the bases 22 and at least a portion of edge surfaces 23 thereof. In addition, the encapsulation 50 can be formed over side surfaces 33 of the microelectronic element 30 that extend between the bottom and top surfaces 31, 32. The encapsulation 50 can protect the microelectronic element 30 to avoid electrical short circuiting between the wire bonds 20, and to help avoid malfunction or possible damage due to unintended electrical contact between a wire bond and the microelectronic element.

The encapsulation 50 can allow for a more robust structure that is less likely to be damaged by testing thereof or during transportation or assembly to other microelectronic structures. The encapsulation 50 can be formed from a dielectric material with insulating properties such as that described in U.S. Patent Application Pub. No. 2010/0232129, which is hereby incorporated by reference herein.

In some embodiments, portions of the wire bonds 20 can remain uncovered by the encapsulation 50, which can also be referred to as unencapsulated portions 24, thereby making the wire bonds available for electrical connection to a conductive feature or element located outside of the encapsulation 50. In some embodiments, at least the tips 21 of the wire bonds 20 and optionally portions of the edge surfaces 23 can remain uncovered by the encapsulation 50, such as described in U.S. Patent Application Pub. No. 2013/0093087, which is hereby incorporated by reference herein. In other words, the encapsulation 50 can cover the entire microelectronic package 30 from the first surface 41 and above, with the exception of a portion of the wire bonds 20, such as the tips 21, portions of the edge surfaces 23, or combinations thereof.

The tips 21 of the wire bonds 20 can extend into a molding film 60 while the encapsulation 50 is formed. The molding film 60 can be provided on an inner surface of a mold plate, for example. After the encapsulation 50 is formed within a mold containing the in-process microelectronic package 10 and the molding film, the molding film can be removed from the encapsulation, such as by applying a suitable chemical to detach or dissolve the molding film. In one embodiment, the molding film 60 can be made from a water soluble plastic material such that it can be removed by exposure to water without affecting the other components of the in-process unit or the microelectronic package 10. In another embodiment, the molding film 60 can be removed from the encapsulation 50 after exposure to ultraviolet light. After removal of the molding film 60, the tips 21 of the wire bonds 20 can remain uncovered and, thus, can be available for electrical connection with other components, such as traces, pads, or terminals of another microelectronic assembly or microelectronic package.

In the embodiment of FIG. 1, the tips 21 of the wire bonds 20 can contact the molding film 60 before the encapsulation 50 is formed, and at least some of the tips of the wire bonds can deflect downward (i.e., toward the first surface 41 of the substrate 40) in the direction D3. Such a downward deflection of at least some of the tips 21 of the wire bonds 20 can prevent the affected tips from being at the major surface 51 of the encapsulation 50 for electrical interconnection with other conductive elements. Also, such a downward deflection of at least some of the tips 21 of the wire bonds 20 can result in electrical short circuiting between the wire bonds, and/or malfunction or possible damage due to unintended electrical contact between a wire bond and the microelectronic element 30.

For example, as shown in FIG. 1, one of the tips 21a of one of the wire bonds 20a can be deflected downward in the direction D3 by the molding film 60 by a distance D, so that the tip 21a moves downward to the position 21b, and the wire bond deflects downward to a position 20b. Such a downward deflection of the wire bond 20a can result in unintended electrical contact between the wire bond and the microelectronic element 30, and/or electrical short circuiting between the wire bonds.

Such downward deflection of the tips 21 of the wire bonds 20 can be a significant problem for BVA and BGA interconnects comprising wire bonds that are about 1 mil or less in diameter (about 25 microns or less). Such a downward deflection of the tips 21 of the wire bonds 20 can also be a problem for BVA and BGA interconnects comprising wire bonds that are greater than 1 mil in diameter. The structures described herein can result in reduced stress at the BVA and BGA interconnection interface. Such structures also permit joining of microelectronic structures with a reduced joining unit size, which can reduce diffusion kinetics and the thickness of joined microelectronic structures.

Figure 2A:
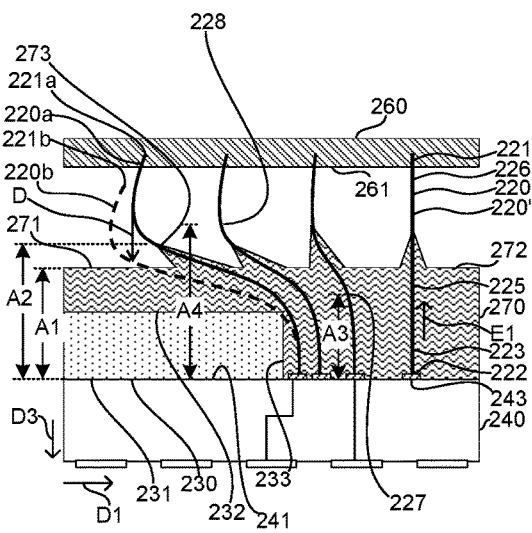
FIG. 2A illustrates a side sectional view of an in-process microelectronic package including wire bonds extending between a substrate and a molding film, according to a variation of the microelectronic package of FIG. 1.
Figure 2B:
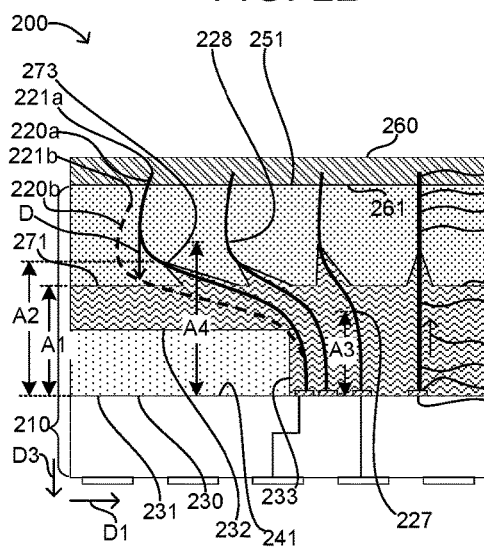
FIG. 2B illustrates a side sectional view of a microelectronic package including wire bonds extending through a stiffening layer and an encapsulant between a substrate film, according to a variation of the microelectronic package of FIG. 1.
Figure 2C:
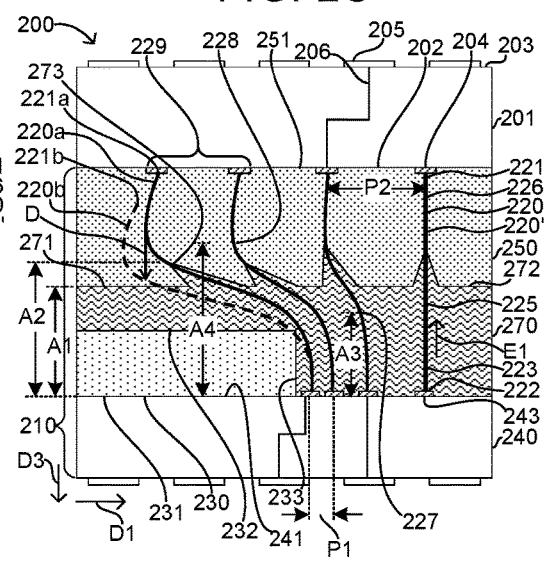
FIG. 2C illustrates a side sectional view of a microelectronic package including wire bonds extending through a stiffening layer and an encapsulant between first and second substrates, according to a variation of the microelectronic package of FIG. 1.

FIGS. 2A-2C illustrate in-process steps in the formation of a microelectronic assembly 200 including a component in the form of a microelectronic package 210 that is a variation of the microelectronic package 10 of FIG. 1. Elements of the microelectronic package 210 that are not described below should be understood to be the same as the corresponding elements described above with reference to the microelectronic package 10 shown in FIG. 1.

The microelectronic assembly 200 can include a microelectronic package 210 joined to and electrically connected with a second substrate 201, in a manner to be described below. The microelectronic package 210 can include a plurality of wire bonds 220 and a microelectronic element 230 joined and electrically connected to a generally planar element in the form of a substrate 240. At least some of the wire bonds 220 can include first portions 225 adjacent the bases 222 of the wire bonds and second portions 226 adjacent the tips 221 of the wire bonds.

The microelectronic package 210 can include an encapsulation 250 that is formed extending between the second portions 226 of the individual wire bonds 220, and a reinforcing dielectric layer 270 that is formed extending between the first portions 225 of the individual wire bonds 220 and overlying the top surface 232 of the microelectronic element 230 and the first surface 241 of the substrate 240. The major surface 251 of the encapsulation 250 can overlie the top surface 232 of the microelectronic element 230. The tips 221 of the at least some of the wire bonds 220 can be exposed at the major surface 251 of the encapsulation 250.

The reinforcing dielectric layer 270 can be formed before formation of the encapsulation 250. The reinforcing dielectric layer 270 can be mechanically coupled with both the microelectronic element 230 and the first surface 241 of the substrate 240. The encapsulation 250 can overlie the upper surface 271 of the reinforcing dielectric layer 270, and can have a major surface 251 overlying the reinforcing dielectric layer and the top surface 232 of the microelectronic element 230.

As shown in FIG. 2A, the reinforcing dielectric layer 270 can be formed extending between the individual wire bonds 220 and overlying the top surface 232 of the microelectronic element 230 and the first surface 241 of the substrate 240. In the embodiment of FIG. 2A, the reinforcing dielectric layer 270 can be formed over the portions of the first surface 241 of the substrate 240 that are not otherwise covered by or occupied by the microelectronic element 230, or the contacts 243. The reinforcing dielectric layer 270 can be an integral, continuous layer formed from a dielectric material. The reinforcing dielectric layer 270 can define an upper surface 271 facing away from the first surface 241 of the substrate 240.

The reinforcing dielectric layer 270 can also substantially cover the microelectronic element 230 and the first portions 225 of the wire bonds 220, including the bases 222 and at least a portion of edge surfaces 223 thereof. In addition, the reinforcing dielectric layer 270 can be formed over side surfaces 233 of the microelectronic element 230 that extend between the bottom and top surfaces 231, 232. The reinforcing dielectric layer 270 can protect the microelectronic element 230 to avoid electrical short circuiting between the wire bonds 220, and to help avoid malfunction or possible damage due to unintended electrical contact between a wire bond and the microelectronic element. In one example, the upper surface 271 of the reinforcing dielectric layer 270 can overlie the top surface 231 of the microelectronic element 230.

The reinforcing dielectric layer 270 can be configured to provide a stiffening function for the first portions 225 of the wire bonds 220. The first portions 225 of the wire bonds 220 can extend within at least a portion of the reinforcing dielectric layer 270. The reinforcing layer 270 can be configured to maintain the position of the tips 221 of the wire bonds 220 in a third direction D3 perpendicular to the first and second directions (D1, D2 of FIG. 4) when a force is applied to the tips of the wire bonds in the third direction.

In a particular example, the reinforcing dielectric layer 270 can have a higher Young's modulus that a Young's modulus of the encapsulation. However, the reinforcing dielectric layer can have a Young's modulus of any suitable value as long as the required stiffening function is provided. In one example, the reinforcing dielectric layer 270 can be made of epoxy, and can have a Young's modulus between 5-50 GPa, and the Young's modulus of the encapsulation 250 can have a value that is lower than, higher than, or the same as the Young's modulus value of the reinforcing dielectric layer.

The upper surface 271 of the reinforcing dielectric layer 270 can have a lower region 272, and protruding regions 273 surrounding respective ones of the wire bonds 220. The lower region 272 can extend between adjacent ones of the protruding regions 273. The lower region 272 can extend to a first peak height A1 from the first surface 241 of the substrate 240, and the protruding regions can extend to second peak heights A2 from the first surface of the substrate. The protruding regions 273 can extend to greater peak heights A2 from the first surface 241 of the substrate 240 than the peak height A1 of portions 272 of the reinforcing dielectric layer 270 between adjacent protruding regions. The peak heights A2 of the protruding regions 273 from the first surface 241 of the substrate 240 can coincide with points of contact between the reinforcing dielectric layer 270 and individual ones of the wire bonds 220. In the examples shown herein, the second peak heights A2 of the protruding regions 273 do not reach the major surface 251 of the encapsulation 250, and the second peak heights A2 of the protruding regions do not reach the tips 221 of the wire bonds 220.

Figure 3:
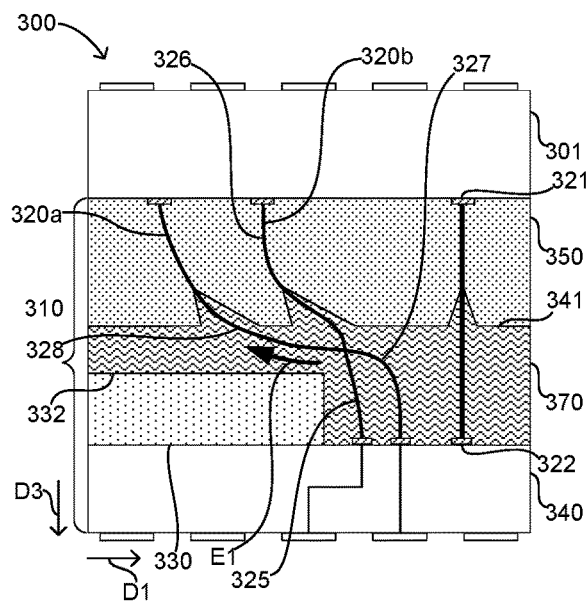
FIG. 3 illustrates a side sectional view of a microelectronic package that is a variation of the microelectronic package of FIG. 2C.

Although the lower region 272 of the upper surface 271 of the reinforcing dielectric layer 270 is shown in FIGS. 2 and 3 as extending to a uniform first peak height A1 from the first surface 241 of the substrate 240, that need not be the case. In some examples, different portions of the lower region 272 of the upper surface 271 of the reinforcing dielectric layer 270 can extend to various first peak heights A1 from the first surface 241 of the substrate 240. In some examples, individual ones of the protruding regions 273 of the upper surface 271 of the reinforcing dielectric layer 270 can each extend a different second peak height A2 from the first surface 241 of the substrate 240. Each protruding region 273 can surround one or more individual ones of the wire bonds 270. Each protruding region 273 can have its second peak height A2 above the first surface 241 of the substrate 240 coinciding with a point of contact with one of the individual ones of the wire bonds 270.

The reinforcing dielectric layer 270 can be formed from a dielectric material with insulating properties such as an epoxy or another suitable polymeric material. The reinforcing dielectric layer 270 can be formed from a dielectric material that is relatively viscous (e.g., more viscous than the material of the encapsulant 250). The reinforcing dielectric layer 270 can be formed of a dielectric material that wets the edge surfaces 223 of the wire bonds 220 and can wick up the edge surfaces during formation to a second peak height A2 from the first surface 241 of the substrate 240. In one example, the protruding regions 273 of the upper surface 271 of the reinforcing dielectric layer 270 can wick up the wire bonds 220 and reach their respective second peak heights A2 before the forming of the encapsulant material 250. In the examples shown herein, the second peak heights A2 of the protruding regions 273 do not reach the tips 221 of the wire bonds 220.

The wire bonds 220 can each have a base 222 joined to a corresponding one of the contacts 243 and a tip 221 remote from the base. At least some of the wire bonds 220 can have first portions 225 extending within at least a portion of the reinforcing dielectric layer 270 and second portions 226 extending within the encapsulation 250. The first portions 225 of at least some of the wire bonds 220 (extending within the reinforcing dielectric layer 270) can each include a first bend 227 changing an extension direction E1 of the respective wire bond in at least one of the first and second directions D1 and D2. In one embodiment, at least some of the first bends 227 of the first portions 225 of the wire bonds 220 can be disposed within the reinforcing dielectric layer 270.

In some examples, the second portions 226 of at least some of the wire bonds 220 (extending within the encapsulation 250) can each include a second bend 228 changing the extension direction E1 of the respective wire bond in at least one of the first and second directions D1 and D2. In one embodiment, at least some of the second bends 228 of the wire bonds 220 can be disposed within the reinforcing dielectric layer 270. In one example, at least some of the first bends 227 and the second bends 228 of the wire bonds 220 can be disposed within the reinforcing dielectric layer 270. As shown in FIG. 2C, it may not be necessary that all of the wire bonds 220 have first and/or second bends 227, 228. For example, the wire bond 220' does not have first or second bends 227, 228.

In a particular example, at least some of the first bends 227 of the wire bonds 220 can be disposed within the reinforcing dielectric layer 270, while at least some of the second bends 228 of the wire bonds 220 can be disposed within the encapsulation 250. In some embodiments, the first and second bends 227, 228 of the wire bonds can permit the tips 221 of a subset 229 of the wire bonds to overlie the top surface 232 of the microelectronic element 230.

The second peak heights A2 of the respective protruding regions 273 can be farther above the first surface 241 of the substrate 240 than the heights A3 of the first bends 227 of the respective wire bonds 220. The heights A4 of the second bends 228 of the respective wire bonds 220 can be farther above the first surface 241 of the substrate 240 than the second peak heights A2 of the respective protruding regions 273.

The first bends 227 and the second bends 228 of the wire bonds 220 can provide a pitch changing function of the wire bonds between the first surface 241 of the substrate 240 and the major surface 251 of the encapsulation 250. As can be seen in the example of FIG. 2C, the bases 222 of the wire bonds 220 can define a first minimum pitch P1 between adjacent ones of the bases and the tips 221 of the wire bonds define a second minimum pitch P2 between adjacent ones of the tips, the second minimum pitch being greater than the first minimum pitch. In one example, the first minimum pitch P1 can be 40-200 microns, and the second minimum pitch P2 can be 150-300 microns.

Similar to FIG. 1, as shown in FIG. 2A, a molding film 260 such similar to the molding film 60 can be lowered onto the tips 221 of the wire bonds 220 extending from the first surface 241 of the substrate 240, to secure the locations of the wire bonds while the encapsulation 250 is formed. The molding film can be deposited onto the tips 221 of the wire bonds 220 after forming the reinforcing dielectric layer 270 and before forming the encapsulation 250 (FIG. 2B).

In the example shown in FIG. 2A, when the tips 221 of the wire bonds contact the molding film after the reinforcing dielectric layer 270 is formed, the reinforcing dielectric layer can maintain the position of the tips 221 of the wire bonds 220 in the third direction D3 when a force is applied to the tips of the wire bonds in the third direction D3. For example, as shown in FIG. 2A, when a molding film is applied to one of the tips 221a of one of the wire bonds 220a, the reinforcing dielectric layer 270 can stiffen the wire bond, thereby preventing the tip from deflecting downward in the direction D3 by a distance D to a position 221b, and preventing the wire bond from deflecting downward to a position 220b.

In some embodiments, before the flowing of the encapsulant material 250 (FIG. 2B), the molding film can be deposited onto the tips 221 of the wire bonds 220 with the tips extending into the molding film as shown in FIG. 2A, the molding film overlying the reinforcing dielectric layer 270. After the tips 221 of the wire bonds 220 contact the molding film, the encapsulant material 250 can be flowed between the upper surface 271 of the reinforcing dielectric layer 270 and a lower surface 261 of the molding film into which the tips of the wire bonds extend as shown in FIG. 2B. After the encapsulation 250 is formed within a mold containing the microelectronic package 210 and the molding film, the molding film 260 can be removed from the encapsulation 250, by any of the removal methods described above with reference to FIG. 1, and the tips 221 of at least some of the wire bonds 220 can be exposed at the major surface 271 of the encapsulation 250.

In some embodiments, the reinforcing dielectric layer 270 can include a first reinforcing dielectric layer overlying the first surface 241 of the substrate 240, and a second reinforcing dielectric layer overlying the first reinforcing dielectric layer and defining the upper surface 271 of the reinforcing dielectric layer. In such embodiments, the first portions 225 can extend through both the first and second reinforcing dielectric layers, and the lower region 272 and the protruding regions 273 of the upper surface 271 of the reinforcing dielectric layer 270 can be formed in the second reinforcing dielectric layer.

As shown in FIG. 2C, the microelectronic assembly 200 can also include a second substrate 201. The second substrate 201 can be a component having first and second opposite surfaces 202, 203. The second substrate 201 can have first terminals 204 at the first surface 202 and second terminals 205 at the second surface 203. At least some of the first terminals 204 can be electrically interconnected to corresponding ones of the second terminals 205. Such an interconnection can be completed using vias 206 formed in the substrate, for example, that can be lined or filled with conductive metal that can be formed of the same material as the first and second terminals 204, 205. The second terminals 205 can be configured for electrical interconnection with an external component such as another microelectronic package or a circuit panel, e.g., a circuit board. In the example shown in FIG. 2C, the tips 221 of the wire bonds 220 can be electrically connected to the first terminals 204 of the second substrate 201.

In one embodiment, the first terminals 204 can be upper terminals of the package 210 at the major surface 251 of the encapsulation. In such an embodiment, the first terminals 204 can be configured to be electrically connected with conductive elements of a component external to the microelectronic package 210, such as the second substrate 201, another microelectronic package, or a circuit panel, e.g., a circuit board.

FIG. 3 illustrates a microelectronic assembly 300 including a component in the form of a microelectronic package 310 that is a variation of the microelectronic package 210 of FIG. 2C. Elements of the microelectronic package 310 that are not described below should be understood to be the same as the corresponding elements described above with reference to the microelectronic package 210 shown in FIG. 2.

The microelectronic assembly 300 can include a microelectronic package 310 joined to and electrically connected with a second substrate 301. The microelectronic package 310 can include a plurality of wire bonds 320 and a microelectronic element 330 joined and electrically connected to a generally planar element in the form of a substrate 340. The microelectronic package 310 can include an encapsulation 350 that is formed extending between second portions 326 of the individual wire bonds 320, and a reinforcing dielectric layer 370 that is formed extending first portions 325 of the individual wire bonds 320 and overlying the top surface 332 of the microelectronic element 330 and the first surface 341 of the substrate 340.

As can be seen in FIG. 3, some of the wire bonds 320a can have first and second bends 327, 328 that change the extension direction E1 of the wire bond by greater angles than the first and second bends of other wire bonds 320b. In such an embodiment, the tip 321 and the base 322 of the wire bond 320a can be offset a greater distance in one or both of the first and second directions D1, D2 than the tip and the base of the wire bond 320b. In a side view, the path of the wire bonds 320a would appear to cross the path of the wire bonds 320b, as shown in FIG. 3.

In the embodiment shown in FIG. 3, the stiffening function of the reinforcing dielectric layer 370 on the wire bonds 320a can be particularly advantageous. Given that the wire bonds 320a have first and second bends 327, 328 that cause the tip 321 and the base 322 of the wire bond to be offset a greater distance in one or both of the first and second directions D1, D2 than the wire bonds of FIG. 2, the tips of such wire bonds 320a may be more easily moved in the third direction D3 than the tips of the wire bonds than FIG. 2C. Therefore, compared to the wire bonds 320b and the wire bonds 220 of FIG. 2C, the reinforcing layer 370 may have a greater effect in maintaining the position of the tips 321 of the wire bonds 220a in the third direction D3 when a force is applied to the tips of the wire bonds in the third direction.

In further variations of the embodiments described above relative to FIGS. 2A-2C and 3, the microelectronic element 230, 330 can be omitted. In such examples, the component can have a structure as described above relative to FIG. 2, for example, but in which the microelectronic element is omitted. In such example, the component can provide a pitch-changing function between the contacts 243 of a substrate and the terminals 204. In a particular example, a microelectronic element can be combined with such a component, for example, by mounting the microelectronic element to the second surface of the substrate after forming the component. Alternatively, the encapsulation of the component can be provided with an opening sized to accommodate placement of the microelectronic element above the substrate's first surface at a time subsequent to the manufacture of the component.

In a further variation, a generally planar element can be provided in place of the substrate 240 shown in FIGS. 2A-2C. In a particular example, the generally planar element can be a microelectronic element. Referring to FIG. 1, in a particular form of this variation, the generally planar element may lack terminals 44 at the second surface 42 opposite from the first surface 41 of the planar element at which wire bonds are joined to the contacts 43.

Figure 4:
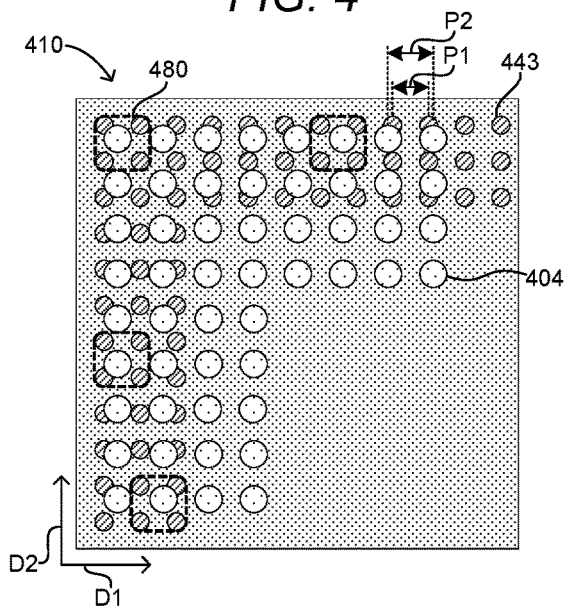
FIG. 4 illustrates one potential diagrammatic top plan view of the encapsulant and the top and bottom contacts of FIG. 2C or FIG. 3.

FIG. 4 illustrates a component in the form of a microelectronic package 410 that is a variation of the microelectronic packages 210 and 310 of FIGS. 2C and 3. Elements of the microelectronic packages 210 and 310 that are not described below should be understood to be the same as the corresponding elements described above with reference to the microelectronic packages 210 and 310 shown in FIGS. 2C and 3.

As described above with reference to FIG. 2C, the first bends and the second bends of the wire bonds can provide a pitch changing function of the wire bonds between the first surface of the substrate and the major surface of the encapsulation. As can be seen in the example of FIG. 4, the contacts 443 to which the bases of the wire bonds can be joined can define a first minimum pitch P1 between adjacent centers thereof, and the upper terminals 404 to which the tips of the wire bonds can be joined can define a second minimum pitch P2 between adjacent centers thereof, the second minimum pitch being greater than the first minimum pitch.

Also, as can be seen in FIG. 4, the number of upper terminals 404 can be less than the number of contacts 443. Therefore, it may be necessary for one or more of the upper terminals 404 to each be connected to at least two of the contacts 443. Such a correspondence is shown in FIG. 4, where the dashed lines 480 enclose exemplary groups of four contacts 443 all shorted together and electrically connected to a single corresponding one of the upper terminals 404. In one example, such shorted-together groups of contacts 443 can be configured to carry power or a reference voltage (i.e., ground).

Figure 5:
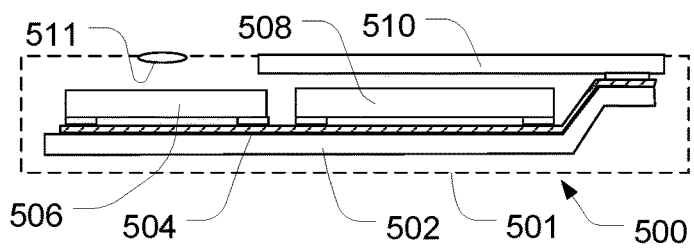
FIG. 5 is a schematic depiction of a system according to one embodiment of the invention.

The microelectronic packages and microelectronic assemblies described above with reference to FIGS. 1-4 above can be utilized in construction of diverse electronic systems, such as the system 500 shown in FIG. 5. For example, the system 500 in accordance with a further embodiment of the invention includes a plurality of modules or components 506 such as the microelectronic packages and microelectronic assemblies as described above, in conjunction with other electronic components 508, 510 and 511.

In the exemplary system 500 shown, the system can include a circuit panel, motherboard, or riser panel 502 such as a flexible printed circuit board, and the circuit panel can include numerous conductors 504, of which only one is depicted in FIG. 5, interconnecting the modules or components 506, 508, 510 with one another. Such a circuit panel 502 can transport signals to and from each of the microelectronic packages and/or microelectronic assemblies included in the system 500. However, this is merely exemplary; any suitable structure for making electrical connections between the modules or components 506 can be used.

In a particular embodiment, the system 500 can also include a processor such as the semiconductor chip 508, such that each module or component 506 can be configured to transfer a number N of data bits in parallel in a clock cycle, and the processor can be configured to transfer a number M of data bits in parallel in a clock cycle, M being greater than or equal to N. In the example depicted in FIG. 5, the component 508 is a semiconductor chip and component 510 is a display screen, but any other components can be used in the system 500. Of course, although only two additional components 508 and 511 are depicted in FIG. 5 for clarity of illustration, the system 500 can include any number of such components.

Modules or components 506 and components 508 and 511 can be mounted in a common housing 501, schematically depicted in broken lines, and can be electrically interconnected with one another as necessary to form the desired circuit. The housing 501 is depicted as a portable housing of the type usable, for example, in a cellular telephone or personal digital assistant, and screen 510 can be exposed at the surface of the housing. In embodiments where a structure 506 includes a light-sensitive element such as an imaging chip, a lens 511 or other optical device also can be provided for routing light to the structure. Again, the simplified system shown in FIG. 5 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A component, comprising:
a generally planar element having oppositely-facing first and second surfaces extending in first and second transverse directions, the generally planar element having a plurality of contacts at the first surface;
a reinforcing dielectric layer overlying the first surface of the generally planar element;
an encapsulation overlying the reinforcing dielectric layer, the encapsulation having a major surface facing away from the first surface of the generally planar element; and
a plurality of wire bonds, each wire bond having a base joined with a contact of the plurality of contacts, and a tip remote from the base at the major surface of the encapsulation, the wire bonds having first portions extending within at least a portion of the reinforcing dielectric layer and second portions extending within the encapsulation, the first portions of at least some of the wire bonds having bends that change an extension direction of the respective wire bond in at least one of the first and second directions,
wherein the reinforcing dielectric layer has protruding regions surrounding respective wire bonds of the plurality of wire bonds, the protruding regions extending to greater peak heights from the first surface of the generally planar element than portions of the reinforcing dielectric layer between adjacent ones of the protruding regions, the peak heights of the protruding regions coinciding with points of contact between the reinforcing dielectric layer and individual ones of the wire bonds.

2. The component of claim 1, wherein the component comprises a microelectronic package, the microelectronic package further including a microelectronic element having oppositely-facing top and bottom surfaces, the bottom surface facing the first surface of the generally planar element and mechanically coupled therewith, and wherein the major surface of the encapsulation overlies the top surface of the microelectronic element.

3. The microelectronic package of claim 2, wherein the tips of a subset of the at least some of the wire bonds overlie the top surface of the microelectronic element.

4. The microelectronic package of claim 2, wherein the dielectric layer overlies the top surface of the microelectronic element.

5. The microelectronic package of claim 2, further comprising a plurality of upper terminals joined with corresponding ones of the wire bonds, the upper terminals at the major surface of the encapsulation and configured to be electrically connected with conductive elements of a component external to the microelectronic package.

6. A microelectronic assembly comprising the microelectronic package of claim 2, the microelectronic assembly further comprising a second component having terminals, the tips of the wire bonds being electrically connected to the terminals.

7. A system comprising the microelectronic package of claim 2 and one or more other electronic components electrically connected to the microelectronic package.

8. The system of claim 7, further comprising a housing, the microelectronic package and the one or more other electronic components being assembled with the housing.

9. The component of claim 1, wherein the bases of the wire bonds define a first minimum pitch between adjacent ones of the bases, and the tips of the wire bonds define a second minimum pitch between adjacent ones of the tips, the second minimum pitch being greater than the first minimum pitch.

10. The component of claim 1, wherein the reinforcing dielectric layer comprises a first reinforcing dielectric layer overlying the first surface of the generally planar element, and a second reinforcing dielectric layer overlying the first reinforcing dielectric layer and defining an upper surface of the reinforcing dielectric layer.

11. The component of claim 1, wherein the bends of the first portions of the wire bonds are first bends, and the at least some of the wire bonds each include a second bend changing the extension direction of the respective wire bond in at least one of the first and second directions.

12. The component of claim 11, wherein at least some of the second bends of the wire bonds are disposed within the reinforcing dielectric layer.

13. The component of claim 1, wherein the reinforcing dielectric layer is configured to maintain the position of the tips of the wire bonds in a third direction perpendicular to the first and second directions when a force is applied to the tips of the wire bonds in the third direction.

14. A microelectronic package, comprising:
a generally planar element having oppositely-facing first and second surfaces extending in first and second transverse directions, the generally planar element having a plurality of contacts at the first surface;
a reinforcing dielectric layer overlying the first surface of the generally planar element;
an encapsulation overlying the reinforcing dielectric layer, the encapsulation having a major surface facing away from the first surface of the generally planar element;
a microelectronic element having oppositely-facing top and bottom surfaces, the bottom surface facing the first surface of the generally planar element and mechanically coupled therewith, the major surface of the encapsulation overlying the top surface of the microelectronic element; and
a plurality of wire bonds, each wire bond having a base joined with a contact of the plurality of contacts, and a tip remote from the base at the major surface of the encapsulation, the wire bonds having first portions extending within at least a portion of the reinforcing dielectric layer and second portions extending within the encapsulation, the first portions of at least some of the wire bonds having bends that change an extension direction of the respective wire bond in at least one of the first and second directions,
wherein the reinforcing dielectric layer extends to a greater peak height from the first surface of the generally planar element than the microelectronic element.

15. The microelectronic package of claim 14, wherein the tips of a subset of the at least some of the wire bonds overlie the top surface of the microelectronic element.

16. The microelectronic package of claim 14, wherein the bends of the first portions of the wire bonds are first bends, and the at least some of the wire bonds each include a second bend changing the extension direction of the respective wire bond in at least one of the first and second directions.

17. A method of forming a component, comprising:
providing a generally planar element having oppositely-facing first and second surfaces extending in first and second transverse directions, the generally planar element having a plurality of contacts at the first surface;
forming a plurality of wire bonds, each wire bond having a base joined with a contact of the plurality of contacts and a tip remote from the base, first portions of at least some of the wire bonds having bends that change an extension direction of the respective wire bond in at least one of the first and second directions;
forming a reinforcing dielectric layer overlying the first surface of the generally planar element, the first portions of the wire bonds extending within at least a portion of the reinforcing dielectric layer, the reinforcing dielectric layer having protruding regions surrounding respective wire bonds of the plurality of wire bonds, the protruding regions extending to greater peak heights from the first surface of the generally planar element than portions of the reinforcing dielectric layer between adjacent ones of the protruding regions, the peak heights of the protruding regions coinciding with points of contact between the reinforcing dielectric layer and individual ones of the wire bonds;
flowing an encapsulation between the reinforcing dielectric layer and a lower surface of a molding film into which tips of the wire bonds extend, the encapsulation having a major surface facing away from the first surface of the generally planar element, the wire bonds having second portions extending within the encapsulation; and
removing the molding film from the encapsulation, the tips of the wire bonds being at the major surface of the encapsulation.

18. The method of claim 17, wherein the component comprises a microelectronic package, the microelectronic package further including a microelectronic element having oppositely-facing top and bottom surfaces, the bottom surface facing the first surface of the generally planar element and mechanically coupled therewith, and wherein the major surface of the encapsulation overlies the top surface of the microelectronic element.

19. The method of claim 17, wherein the protruding regions wick up the wire bonds and reach their respective peak heights before the flowing of the encapsulation.

20. The method of claim 19, wherein the peak heights of the protruding regions do not reach the tips of the wire bonds.

21. The method of claim 17, further comprising, before the flowing of the encapsulation, depositing the molding film overlying the reinforcing dielectric layer, the tips of the wire bonds extending into the molding film.

\* \* \* \* \*